(12) United States Patent
Chien

(10) Patent No.: US 6,297,160 B1
(45) Date of Patent: Oct. 2, 2001

(54) APPLICATION OF PURE ALUMINUM TO PREVENT PAD CORROSION

(75) Inventor: Wen-Cheng Chien, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/266,881

(22) Filed: Mar. 12, 1999

(51) Int. Cl.$^7$ .............................................. H01L 21/3065
(52) U.S. Cl. .................... 438/706; 438/710; 438/712; 438/719; 438/720
(58) Field of Search ..................... 438/706, 710, 438/712, 720, 612, 618, 622, 629, 695, 696, 963

(56) References Cited

U.S. PATENT DOCUMENTS

| | | | |
|---|---|---|---|
| 5,476,815 | * 12/1995 | Kawasumi | 438/613 |
| 5,525,546 | 6/1996 | Harada et al. | 437/209 |
| 5,559,056 | * 9/1996 | Weiler | 437/195 |
| 5,565,378 | 10/1996 | Harada et al. | 437/182 |
| 5,595,934 | * 1/1997 | Kim | 437/180 |
| 5,661,081 | 8/1997 | Hsue et al. | 438/106 |
| 5,707,894 | * 1/1998 | Hsiao | 438/614 |
| 5,731,243 | 3/1998 | Peng et al. | 438/612 |
| 5,824,234 | * 10/1998 | Jou et al. | 216/18 |
| 5,854,119 | * 12/1998 | Wu et al. | 438/396 |
| 5,904,556 | * 5/1999 | Suzuki et al. | 438/623 |
| 5,911,887 | * 6/1999 | Smith et al. | 216/72 |
| 5,930,664 | * 7/1999 | Hsu et al. | 438/612 |

* cited by examiner

Primary Examiner—Benjamin L. Utech
Assistant Examiner—Lan Vinh
(74) Attorney, Agent, or Firm—George O. Saile; Stephen B. Ackerman

(57) ABSTRACT

A method of forming a layer of top level metal within a semiconductor bonding pad that eliminates the formation of surface pitting and surface corrosion that using Prior Art occur due to the presence of minor traces of copper or silicon in that surface. A layer of pure aluminum is deposited on top of the first level metal surface, this level of pure aluminum prevents the occurrence of surface pitting and surface corrosion.

23 Claims, 4 Drawing Sheets

APPLICATION OF PURE ALUMINUM TO PREVENT PAD CORROSION

BACKGROUND OF THE INVENTION (1) Field of the Invention

The present invention relates to the fabrication of semiconductor circuits, and more specifically to a method for forming bonding pads such that bonding pad corrosion is eliminated for bonding pads whose top metal surface contain minute amounts of copper and silicon.

(2) Description of the Prior Art

For many of the advanced semiconductor devices, device signals such as ground, power and I/O signals require numerous bonding pads. With the increased density of components within a chip and with increased sophistication of the circuitry contained within the chip, further demands are placed on the number of bonding pads for each chip. For many designs, the number of bonding pads becomes the limiting factor on chip size and chip function.

Improvements in packing density cannot be realized by simply shrinking the design rules or adding more levels of metal wiring.

Aluminum grows a passivating oxide layer in air and is as a consequence protected against corrosion. Aluminum wiring used in semiconductors, however, contains copper, which does not have a passivating oxide, and the Al—Cu alloy used is more vulnerable to corrosion. The corrosion of aluminum wires is caused by several sources such as chlorine transported through the plastic packaging and the passivation materials, chlorine from the etching compounds and as etching by-products, phosphorous acid formed from excess phosphorous in the phosphosilicate glass, etc. Only a small amount of chlorine is required to cause severe local corrosion of the aluminum lines. Aluminum corrosion can, in addition, occur very quickly after metal etching.

To avoid etching introduced corrosion, chlorine compounds and elemental chlorine must be removed from the metal surface immediately after plasma etching. This is usually accomplished by a water rinse or a water vapor treatment.

Modern metal structures use multi-levels of dissimilar materials such as Ti/TiN/Al—Cu/TiN or Ti/Al—Cu/TiN which increases the possibility of electromechanical corrosion.

Copper is electro-positive with respect to hydrogen and is not vulnerable to corrosion. However, in air copper oxide grows linearly with time, indicating the lack of a protective oxide. This lack of a passivating oxide makes copper more vulnerable to chemical corrosion. To avoid or minimize this corrosion, most applications of copper metalization involve some protective layer deposited on top of the copper.

FIG. 1 shows a cross section of a typical Prior Art bond pad. Bonding pads serve the function of providing device signals such as ground, power and I/O signals to semiconductor devices. In this capacity a bonding pad provides an electrical path between the semiconductor device and the electrical circuitry and components with which the semiconductor device interfaces. The bonding pad structure provides for an opening to which one contact point of the semiconductor devices is connected, from this bonding pad opening the electrical path continues through the bonding pad to a metal plate that connects with the electrical circuitry and components with which the semiconductor device interfaces. Where this connecting electrical path consists of Al—Cu, top metal surface corrosion and pitting is a problem within the opening of the bonding pad.

Referring now specifically to FIG. 1, there is shown a cross section of a typical Prior Art bonding pad. The metal layer 10 connects the bonding pad with the electrical circuitry and components with which the semiconductor device interfaces, the semiconductor device is connected to the bonding pad via the opening 18. A layer 14 of Al—Cu provides the electrical path between metal 10 and opening 18. A layer 26 of dielectric is deposited over the metal layer 10, a via hole 12 is etched in this dielectric layer 26. A passivation layer 24 is deposited on top of the Al—Cu layer 14, the opening 18 is etched into this passivation layer 24. The passivation layer 24 is separated from the metal layer 14 by a layer 16 of anti-reflective coating (ARC). Surface pitting 20 and surface corrosion 22 occur on the surface of top metal layer 14 within the opening 18 of the bonding pad.

FIG. 2 shows the processing steps required to create a typical Prior Art bonding pad. The numbers indicated within the following description of the processing steps required to created a Prior Art bonding pad refer to the numbers that have previously been used under FIG. 1. The bonding pad is constructed starting with the original metal 10 (FIG. 2, step 1). On top of this metal 10 a layer 26 of dielectric is deposited (step 2). Via 12 is created within the dielectric 26 (step 3), a layer 14 of Al—Cu is deposited across the dielectric 26 and the via 12 (step 4). A layer 16 of ARC is deposited on top of the layer 14 of Al—Cu (step 5). A passivation layer 24 is deposited over the ARC layer 16 (step 6). The bonding pad opening 18 is etched within the passivation layer 24 (step 7).

U.S. Pat. No. 5,661,081 (Hsue et al.) teaches an Al or Al alloy bonding pad. However, this reference differs from the invention.

U.S. Pat. No. 5,731,243 (Peng et al.) shows a method to reduce residue formation over an Al bond pad.

U.S. Pat. No. 5,559,056 (Weiler) shows a bond layer over a bonding pad.

U.S. Pat. No. 5,525,546 (Harada et al.) shows an Al alloy bonding pad and method.

U.S. Pat. No. 5,565,378 (Harada et al.) shows a method of passivating an Al bonding pad using an $O_3$ solution.

SUMMARY OF THE INVENTION

It is the primary objective of the present invention to prevent surface pitting and corrosion of the top level metal within bonding pads.

A bonding pad is a semiconductor structure that provides an interface between a semiconductor device and other electrical circuitry and components. A bonding pad is therefore in physical contact with a metal layer (the metal layer that provides electrical stimuli to the semiconductor device) and provides electrical continuity between that layer of metal and the semiconductor device. According to the present invention, a layer of pure aluminum is deposited on the top layer of metal within the bonding pad. This layer of pure aluminum stops the surface pitting and corrosion of the top metal surface within the bonding pad.

DETAILED DESCRIPTION OF THE PREFERRED EMBODIMENT

Figure 3:
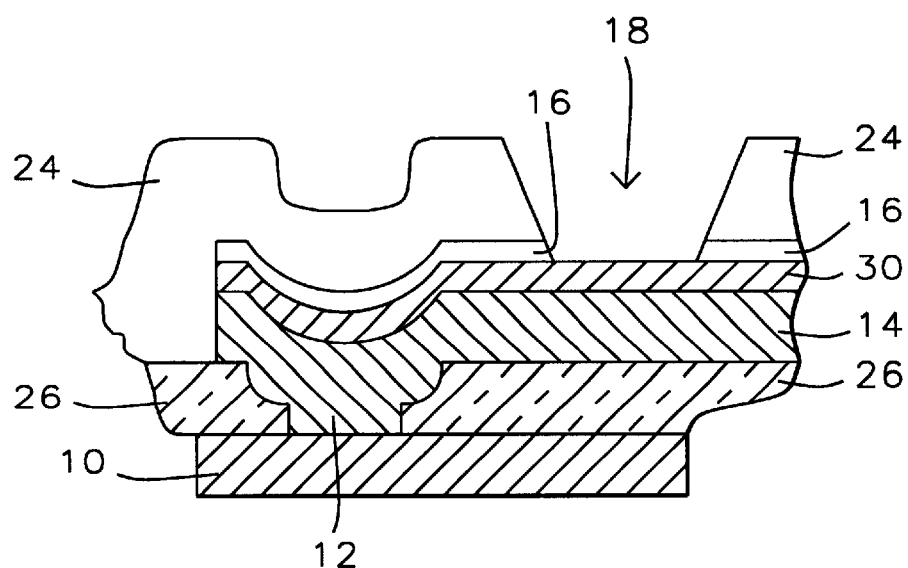
FIG. 3 shows a cross section of a bonding pad in accordance with the present invention.

FIG. 3 shows a cross section of a bond pad according to the present invention. The metal layer 10 connects the bonding pad with the electrical circuitry and components with which the semiconductor device interfaces, the semiconductor device is connected to the bonding pad via the opening 18. A layer 14 of Al—Cu provides the electrical path between metal 10 and socket 18. A via opening 12 is etched into the layer of dielectric 26 that is deposited on top of metal layer 10. A layer 30 of pure aluminum is deposited on top of the Al—Cu metal layer 14, this layer 30 of pure aluminum eliminates the surface pitting and corrosion of the surface of the top level metal within the bonding pad. An ARC layer 16 is formed on top of the pure aluminum layer 30, a passivation layer 24 is deposited on top of the ARC layer 16. The opening 18 is etched within the passivation layer 24 through the ARC down to the top surface of the layer 30 of pure aluminum.

Figure 1:
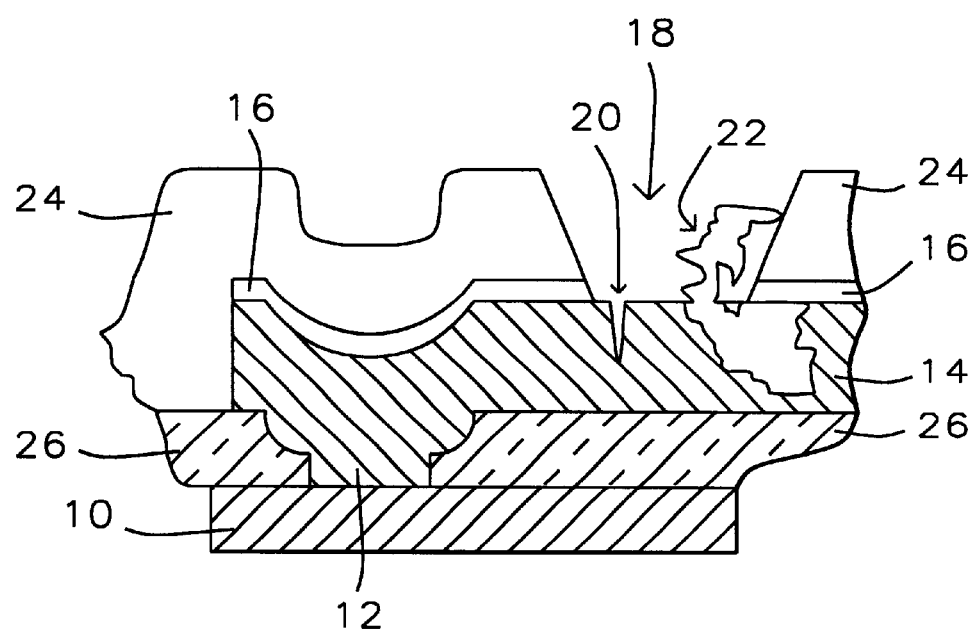
FIG. 1 shows a cross section of a Prior Art bonding pad.
Figure 2:
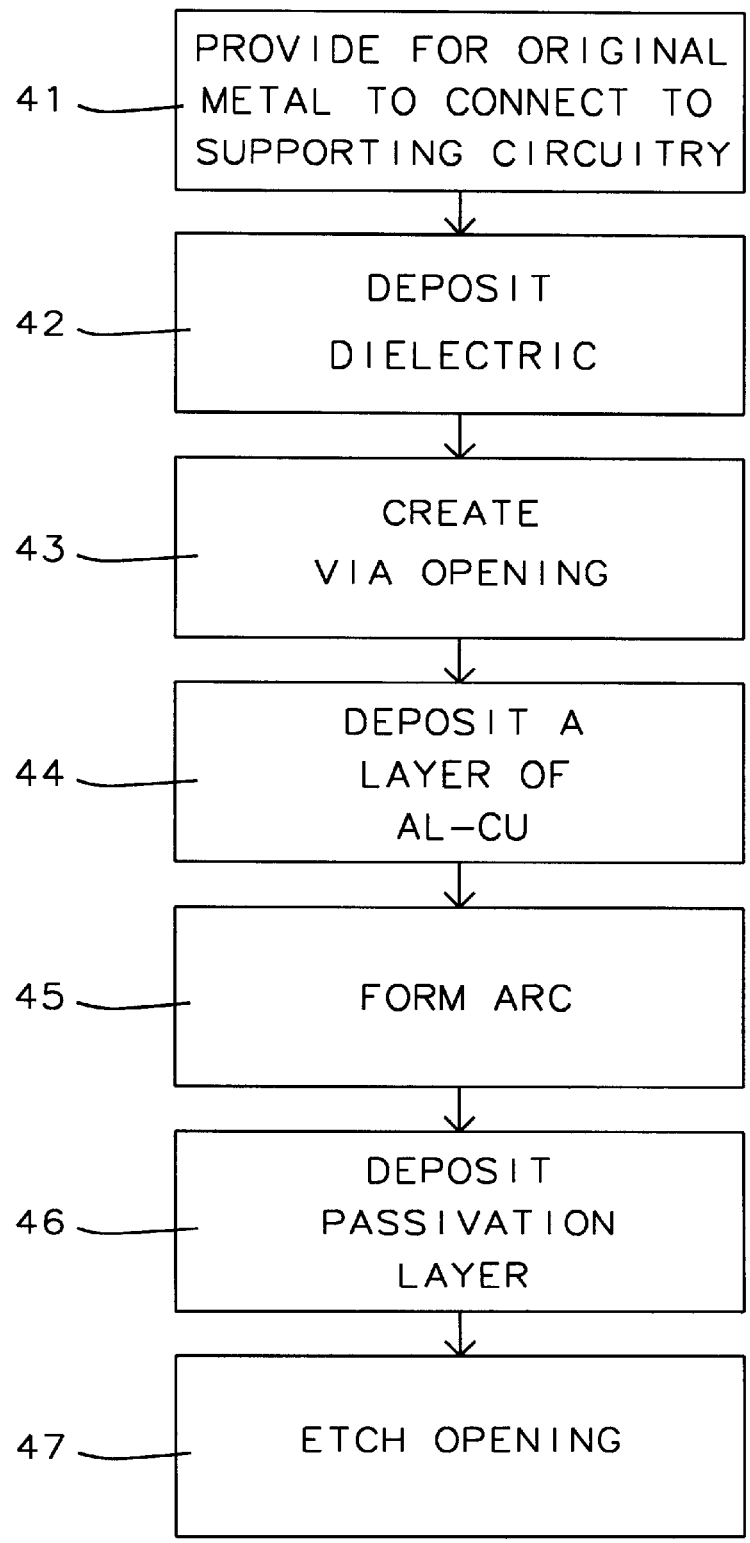
FIG. 2 shows the processing steps required to create a Prior Art bonding pad.

It is well known in the art that pure aluminum interacts with oxygen and forms aluminum oxide as a result of this interaction. Since oxygen is present in abundance in air, exposing pure aluminum to air creates a layer of aluminum oxide on the surface of the exposed layer of aluminum. It follows from this that the pure aluminum that comprises the deposited layer 30 interacts with oxygen (which is present in air) to form a thin layer of aluminum oxide ($Al_2O_3$) over the surface of the layer 30. This layer of $Al_2O_3$ is essentially uniform in thickness and as such prevents localized oxidation that, in Prior Art applications, leads to the previously highlighted pitting (20, FIG. 1) and corrosion (22, FIG. 1).

Figure 4:
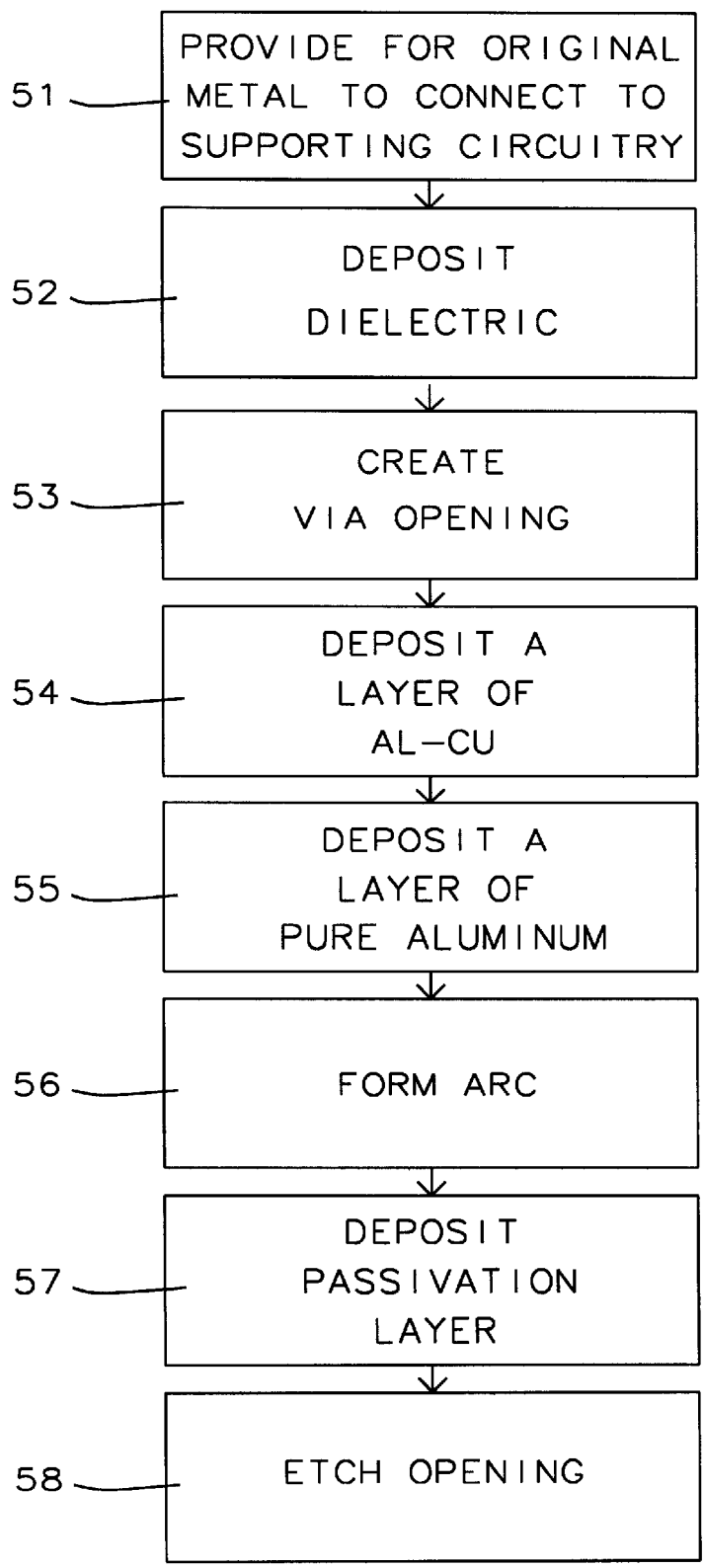
FIG. 4 shows the processing steps required to create a bonding pad in accordance with the present invention.

FIG. 4 shows the processing steps required to create bonding pad in accordance with the present invention. The numbers indicated within the following description of the processing steps required to create a bonding pad in accordance with the present invention refer to the numbers that have previously been used under FIG. 3. The bonding pad is constructed starting with the original metal 10 (FIG. 4, step 1). On top of this metal a layer 26 of dielectric is deposited, (step 2). Via 12 is etched within the dielectric 26 (step 3), a layer 28 of Al—Cu is deposited across the dielectric 26 and the via 12 (step 4). At this point the formation of the bonding pad differs with the Prior Art in that a layer 30 of pure aluminum is deposited on top of the Al—Cu layer 14, step 5. An ARC layer 16 is formed on top of the layer 30 of pure aluminum (step 6). A passivation layer 24 is deposited over the ARC layer 16 (step 7). The bonding pad opening 18 is etched within the passivation layer 24 (step 8).

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of fabricating bonding pads on a semiconductor device formed on a semiconductor wafer, said semiconductor device including a substrate, said method comprising the steps of:

providing top level metal within said bonding pads, said top level metal comprising an aluminum-copper alloy;

depositing a layer of pure aluminum on top of said top level metal; and establishing a path for electrical contact between said top level metal and said semiconductor device.

2. The method of claim 1, the step of depositing a layer of pure aluminum comprising depositing pure aluminum using reactive sputtering.

3. The method of claim 1 wherein said establishing a path for electrical contact between said top level metal and said semiconductor device is:

forming an anti-reflective coating on the top surface of said pure aluminum;

depositing a passivation layer over said anti-reflective coating; and etching an opening into said passivation layer through said anti-reflective coating down to the top surface of said layer of pure aluminum.

4. The method of claim 1 wherein said layer of pure aluminum over said metal layer provides an oxide film of $Al_2O_3$.

5. The method of claim 1 wherein providing top level metal within said bonding pads comprises the steps of:

depositing a first metallization layer over said substrate;

depositing a dielectric layer over said metallization layer;

etching a via hole into said dielectric; and depositing a second metal layer over said dielectric and within said via hole, said second level metal layer comprising an aluminum-copper alloy.

6. The method of claim 5, the step of depositing a first metallization layer comprising depositing aluminum by reactive sputtering.

7. The method of claim 5, the step of depositing a second metallization layer comprising depositing Al—Cu using reactive sputtering.

8. The method of claim 2 wherein said etching step is performed by a dry etching method.

9. The method of claim 5, said metallization layer over said substrate forming an electrical interface between said bonding pad and electrical components and devices that provide stimuli to and extract electrical responses from said semiconductor device.

10. A method of fabricating bonding pads on a semiconductor device formed on a semiconductor wafer, said semiconductor device including a substrate, said method comprising the steps of:

depositing a first metallization layer over said substrate, forming an electrical interface between said bonding pad and electronic components and devices that supply stimuli to or extract electrical responses from said semiconductor device;

depositing a dielectric layer over said metallization layer, forming a basis for creating a via opening;

etching a via hole through said dielectric, establishing a first phase of an electrical path between said metallization layer over said substrate and top level metal of said bonding pad;

depositing a second metal layer over the surface of said layer of dielectric and in said via hole, creating top level metal layer of said bonding pad, completing an electrical path between said metallization layer over said substrate and top level metal of said bonding pad, said second level metal layer comprising an aluminum-copper alloy;

depositing a layer of pure aluminum over the surface of said top level metal layer, preventing surface pitting and surface corrosion of the surface of said top level metal;

forming an anti-reflective coating over the surface of said layer of pure aluminum;

depositing a passivation layer over the surface of said anti reflective coating, protecting and electrically isolating said layer of top level metal; and etching an opening through said passivation layer, further through said anti-reflective coating down to the surface of said layer of pure aluminum, creating an electrical point of contact for said semiconductor device.

11. The method of claim 10, said first metallization layer over said substrate forming an electrical interface between said bonding pad and electrical components and devices providing stimuli to and extracting electrical responses from said semiconductor device.

12. The method of claim 10 wherein said layer of pure aluminum over said metal layer provides an oxide film of $Al_2O_3$.

13. The method of claim 10, the step of depositing a first metallization layer comprising depositing aluminum by reactive sputtering.

14. The method of claim 10, the step of depositing a second metallization layer comprising depositing Al—Cu using reactive sputtering.

15. The method of claim 10 wherein said etching steps are performed by a dry etching method.

16. The method of claim 10, the step of depositing a layer of pure aluminum comprising depositing pure aluminum using reactive sputtering.

17. A method of fabricating bonding pads on a semiconductor device formed on a semiconductor wafer, said semiconductor device including a substrate, said method comprising the steps of:

depositing a first metallization layer over said substrate;

depositing a dielectric layer over said metallization layer;

masking a portion of said dielectric layer in preparation for a first etching step;

etching the dielectric layer utilizing the dielectric mask as a mask for the dielectric layer;

depositing a second metallization layer overlaying said dielectric layer with the inclusion of the openings etched into said dielectric layer, said second level metallization layer comprising an aluminum-copper alloy;

depositing a layer of pure aluminum overlaying said second metallization layer;

forming a anti-reflective coating over the surface of said layer of pure aluminum;

depositing a passivation layer over the surface of said anti-reflective coating;

masking a portion of said passivation layer in preparation for a second etching step; and etching said passivation layer, further etching through the anti-reflective coating to the surface of said layer of pure aluminum, forming an exposed region of pure aluminum, forming a bond region of pure aluminum.

18. The method of claim 17, said first metallization layer over said substrate forming an electrical interface between said bonding pad and electrical components and devices that provide stimuli to and extract electrical responses from said semiconductor device.

19. The method of claim 17, said layer of pure aluminum over said metal layer providing an oxide film of $Al_2O_3$.

20. The method of claim 17, the step of depositing a first metallization layer comprising depositing aluminum by reactive sputtering.

21. The method of claim 17, the step of depositing a second metallization layer comprising depositing Al—Cu using reactive sputtering.

22. The method of claim 17 wherein said etching steps are performed by a dry etching method.

23. The method of claim 17, the step of depositing a layer of pure aluminum comprising depositing pure aluminum using reactive sputtering.

* * * * *